(12) United States Patent
Hunt

(10) Patent No.: US 7,045,761 B2
(45) Date of Patent: May 16, 2006

(54) SELF-PIXELATING FOCAL PLANE ARRAY WITH ELECTRONIC OUTPUT

(75) Inventor: Jeffrey H. Hunt, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 32 days.

(21) Appl. No.: 10/873,045

(22) Filed: Jun. 21, 2004

(65) Prior Publication Data

US 2005/0279920 A1 Dec. 22, 2005

(51) Int. Cl.
*H01L 27/00* (2006.01)

(52) U.S. Cl. .................................. 250/214 R; 257/438

(58) Field of Classification Search ............ 250/208.1, 250/208.2, 214.1, 214 R; 257/186, 438
See application file for complete search history.

(56) References Cited

U.S. PATENT DOCUMENTS

| | | | | |
|---|---|---|---|---|
| 4,963,727 A * | 10/1990 | Cova | ....................... | 250/214 R |
| 5,521,743 A | 5/1996 | Holmes et al. | | |
| 6,654,215 B1 * | 11/2003 | Green | ........................ | 361/56 |
| 6,720,588 B1 * | 4/2004 | Vickers | ...................... | 257/186 |
| 6,797,581 B1 * | 9/2004 | Vickers | ...................... | 438/380 |
| 2004/0245592 A1 * | 12/2004 | Harmon et al. | ............. | 257/438 |
| 2005/0012033 A1 * | 1/2005 | Stern et al. | ............. | 250/214 R |

OTHER PUBLICATIONS

J.H. Hunt and R.B. Holmes "Thermo-optic investigation of heating during electrical breakdown in avalanche photodiodes" J. Applied Physics, vol. 76, Nov. 1, 1994, p. 5054.

J.H. Hunt and R.B. Holmes "Observation of optical response of avalanche photodiodes at photon-counting light levels." Applied Physics letters, vol. 64, May 30, 1994, p. 2925.

* cited by examiner

*Primary Examiner*—Stephone B. Allen
*Assistant Examiner*—Davienne Monbleau
(74) *Attorney, Agent, or Firm*—MacPherson Kwok Chen & Heid LLP; Clifford G. Cousins

(57) ABSTRACT

The present application is directed to a self-pixelating focal plane array and includes a photodetection portion having a body defining a self-pixelating active detection region, and a readout device in electrical communication with the photodetection portion and configured to capture electrical charges from the photodetection portion. During use, the photodetection portion is configured to operate in Geiger mode. As such, the application of one or more electrical fields to the photodetection portion results in the photodetection portion operating in a self-pixelating manner. The readout device may be used to capture the electrical charges and signals generated by the photodetection portion due to the incidence of one or more photons on the photodetection portion.

21 Claims, 3 Drawing Sheets

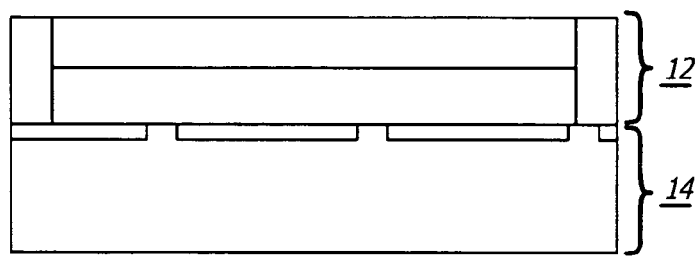
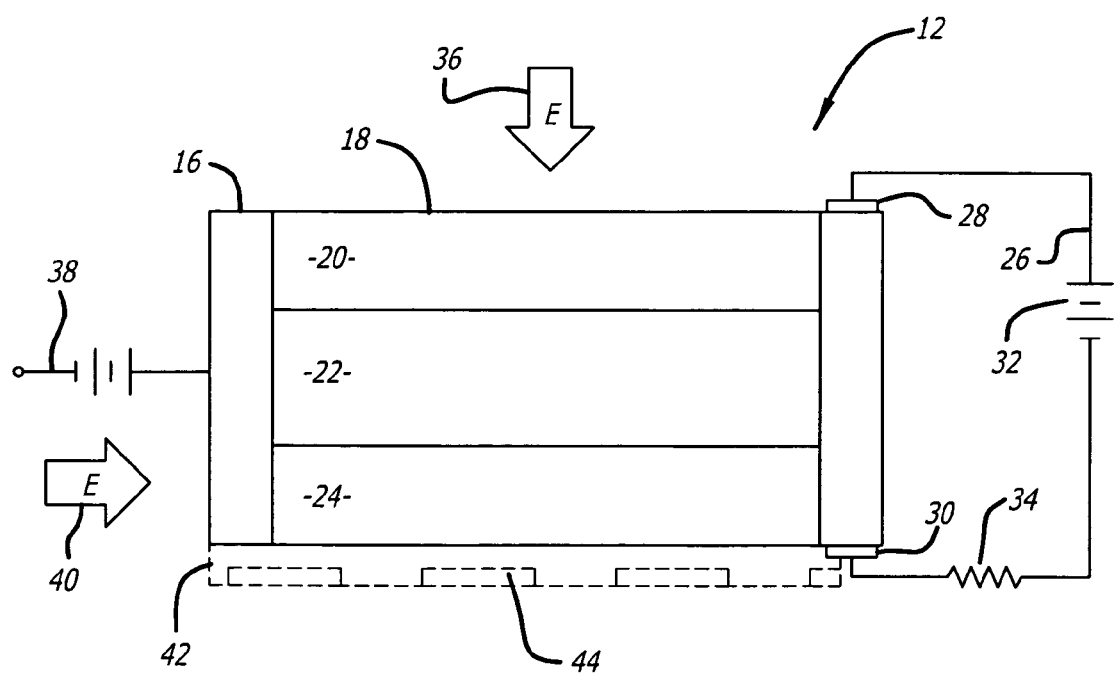

SELF-PIXELATING FOCAL PLANE ARRAY WITH ELECTRONIC OUTPUT

BACKGROUND

Optical detectors and focal plane arrays are presently used in a number of industries to capture light for analysis. Presently, there is a great deal of interest in producing optical detectors and focal plane arrays with higher sensitivity to incident light while decreasing the noise produced within the detector or focal plane array.

One class of device currently in use comprises a photodetection device having an active detection area which is matched to an optical readout chip. During manufacture, great care must be taken when coupling the readout chip to the photodetection device. Typically, the photodetection device and the readout chip are positioned within a high vacuum chamber and the contact surfaces of each device are cleaned to ensure the surfaces are free of molecular contaminants. Thereafter, a bonding agent may be applied to a surface of at least one of the photodetection device and/or the readout chip, thereby bonded the photodetection device and readout chip together. Typically, these devices are referred to as "flip-chip" devices. While these devices have proven useful in detecting incident radiation, a number of shortcoming have been identified.

During use, imaging information is derived by knowing precisely which pixel of the active detection area of the photodetection device generated an electrical signal within the readout chip. Since pixel sizes are quite small, it is imperative that the non-conducting and conducting regions of the photodetection device and readout chip overlap and maintain their position relative to each other during the manufacturing process. Typically, the manufacturing process incorporates extensive procedures to align and register the photodetection device and readout chip. As such, manufacturing yields are not high. Furthermore, the manufacturing process is quite lengthy, labor intensive, and costly.

Thus, in light of the foregoing, there is an ongoing need for a self-pixelating focal plane array which can be produced more efficiently.

BRIEF SUMMARY

Various embodiments of self-pixelating focal plane arrays with electronic outputs are disclosed herein. In addition, the present application discloses various methods of manufacturing various embodiments of self-pixelating focal plane arrays.

In one embodiment, the present application discloses a self-pixelating focal plane array and includes a photodetection portion having a body defining a self-pixelating active detection region, and a readout device in electrical communication with the photodetection portion and configured to capture electrical charges from the photodetection portion. During use, the photodetection portion is configured to operate in Geiger mode. As such, the application of one or more electrical fields to the photodetection portion results in the photodetection portion operating in a self-pixelating manner. The readout device may be used to capture the electrical charges and signals generated by the photodetection portion due to the incidence of one or more photons on the photodetection portion.

In another embodiment, the present application discloses a self-pixelating focal plane array and includes at least one photodiode having a body defining an active detection region, a voltage source in communication with the at least one photodiode and configured to operate the at least one photodiode in Geiger mode, and a readout device in electrical communication with the at least one photodiode.

In still another embodiment, the present application discloses at least one photodiode having a body defining an active detection region, the at least one photodiode configured to operate in Geiger mode, and a readout device coupled to the at least one photodiode in flip chip relation, wherein the readout chip is in electrical communication with the at least one photodiode.

In addition, the present application discloses various methods of manufacturing a self-pixelating focal plane array. One method of manufacturing a self-pixelating focal plane array includes providing a photodetection portion and a readout device, configuring the photodetection portion to operate in Geiger mode, coupling the readout device to the photodetection portion, creating a self-pixelating photodetection portion by operating the photodetection portion in Geiger mode, and capturing electrical charges received from the photodetection portion with the readout device.

In an alternate embodiment, a self-pixelating focal plane array may be manufactured by providing one or more avalanche photodiodes, providing one or more flip-chip readout devices, coupling the one or more flip-chip readout devices to the one or more avalanche photodiodes wherein the one or more flip-chip devices are in electrical communication with the one or more avalanche photodiodes, biasing the one or more photodiodes to operate in Geiger mode wherein the photodiodes become self-pixelating, and capturing electrical charges generated within the photodiodes with the readout devices.

Other features and advantages of the embodiments of the self-pixelating focal plane arrays with electronic outputs as disclosed herein will become apparent from a consideration of the following detailed description.

BRIEF DESCRIPTION OF THE DRAWINGS

A self-pixelating focal plane array with an electronic output will be explained in more detail by way of the accompanying drawings, wherein:

FIG. 1 shows a cross sectional view of an embodiment of a self-pixelating focal plane array with electronic outputs;

FIG. 2 shows cross sectional view of an embodiment of a photodetection portion for use with a self-pixelating focal plane array;

DETAILED DESCRIPTION

Figure 3:
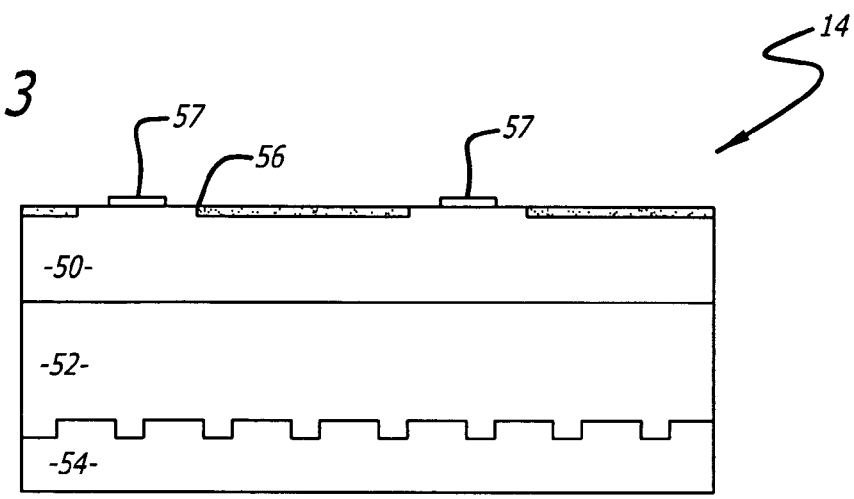
FIG. 3 shows cross sectional view of an embodiment of a readout device for use with a self-pixelating focal plane array.

FIG. 1 shows an embodiment of a self-pixelating focal plane array. In one embodiment, the self-pixelating focal plane array 10 includes a photodetection portion 12 coupled to or otherwise in communication with a readout device 14. For example, in one embodiment, the photodetector portion 12 comprises an avalanche photodiode while the readout device 14 comprises an integrated circuit detector or readout chip. In an alternate embodiment, the self-pixelating focal plane array 10 may comprise a monolithic electromagnetic radiation detector array formed by coupling one or more readout chips to one or more avalanche photodiodes using a flip-chip manufacturing process.

FIG. 2 shows a cross sectional view of an embodiment of the photodetection portion 12 configured for use with the self-pixelating focal plane array. As shown, the photodetection portion 12 includes a body 16 having an active detection area 18 defined therein. In one embodiment, the photodetection portion 12 comprises an avalanche photodiode having a first layer 20, a second layer 22, and a third layer 24. Optionally, the first layer 20 may comprise a positively doped semi-conductive material configured to permit an avalanche of electrons to be freed when struck with a photon. For example, in one embodiment the positively doped semi-conductive material comprises silicon. In an alternate embodiment, the first layer 20 is comprised of indium phosphide and is heavily doped with a P-type material such as zinc. As such, the first layer 20 may lose its semi-conductive properties and function similar to a conductor. Further, the second layer 22 may optionally be either a negative layer or an insulator. For example, the second layer 22 maybe manufactured without doping or with low doping. Similarly, the third layer 24 may be a negative layer. In one embodiment, the third layer 24 is moderately doped with an N-type material. In another embodiment, the third layer 24 is heavily doped with an N-type material such as sulfur, for example, such that the third layer no longer behaves as a semiconductor but instead has a reasonable good conductivity.

Referring again to FIG. 2, in one embodiment, a circuit 26 may be connected to the photodetection portion device 12 with a first and second electrode 28, 30. The circuit 26 may include a voltage source 32 configured to apply a charge across the photodetection portion 12. optionally, a circuit resistor 34 may be positioned between the voltage source 32 and at least one of the electrodes 28, 30. As a result, a first electric field 36 may be created across the photodetection portion 12. As such, the photodetection portion 12 may be configured to be operated in Gieger mode. As shown in FIG. 2, the first electric field 36 is substantially perpendicular to the layers (20, 22, 24) of the active detection area 18. Optionally, a second circuit 38 may also be coupled to the photodetection portion 12. As such, a second electric field 40 may be created within or surrounding the photodetection portion 12. In the illustrated embodiment, the second electric field 40 is perpendicular to the first electric field 36. Optionally, any number of electric fields or field directions may be used. Furthermore, the photodetection portion 12 may be manufactured in any number of sizes or shapes as desired. In an alternate embodiment, the photodetection portion 12 comprises any number or variety of alternate photodetection devices, including, without limitation, charge coupled devices, photo multipliers, and similar devices.

Optionally, the photodetection portion 12 may include a coupling layer 42 configured to electrically, mechanically, or electro-mechanically couple the photodetection portion 12 to the readout device 14. As such, the coupling layer 42 may be formed from a conductive material, an insulating material, and/or a dielectric material. Further, the coupling layer 42 may include one or more contact areas 44 formed thereon. As such, the contact areas 44 may be formed from a conductive material, an insulating material, and/or a dielectrical material. For example, in one embodiment, the contact areas 44 comprise conductive pads configured to electrically couple the photodetection portion 12 to the readout device 14.

As stated above, the photodetection device 12 may comprise one or more avalanche photodiodes configured to be operated in Geiger mode. As such, the incidence of a photon having an energy below the bandgap of the photodiode causes a chain reaction or avalanche of electrons in a photodiode material. The avalanche of electrons within the photodiode material continues until the current within the electrical field applied to the photodiode drops to zero or until the voltage falls below the breakdown voltage. Further, the avalanche of electrons may be confined within a microchannel formed within the materials forming the photodiode. As a result, the photodiode operated in Geiger mode is self-pixelating. The one or more photodiodes used to form the photodetection portion 12 may be manufactured from any variety of material, including, without limitation, Indium Gallium Arsenide (InGaAs), Silicon (Si), Germanium (Ge), Gallium Nitride (GaN), Silicon Carbide (SiC), or any other suitable materials.

FIG. 3 shows a cross sectional view of an embodiment of a readout device 14 for use with various embodiments of a self-pixelating focal plane array. As shown, the readout device 14 may comprise a first layer 50, a second layer 52, and a substrate 54. In one embodiment, the first layer 50 is formed from a semi-conductive material, including, for example, silicon. As shown in FIG. 3, the first layer 50 may include one or more integrated circuit devices 56 position thereon. Exemplary integrated circuit devices 56 may include, without limitation, amplifiers, processors, assignment specific integrated circuits, and the like. The integrated circuit devices 56 may be configured to capture, amplify, and/or read out a pixilated radiation intensity pattern from the photodetection portion 12. (See FIG. 2). As such, the readout device 14 may form a flip-chip readout chip configured to be electrically, mechanically, or electro-mechanically coupled to the photodetection portion 12. Optionally, the first layer 50 may further include one or more bond pads, contacts, conduits, and/or leads thereby permitting the readout device 14 to be electrically coupled to the photodetection portion 12. FIG. 3 shows an embodiment of a readout device 14 having one or more contact pads 57 formed thereon.

Referring again to FIG. 3, the second layer 52 of the readout device 14 may comprise a compensation layer bonded or otherwise coupled to the first layer 50. As such, the second layer 52 may provide structure support to the first layer 50. In addition, the second layer 52 may effectuate the transfer of heat from the photodetection portion 12, the first layer 50, and/or the integrated circuit devices 56. The substrate layer 54 may further assist in the transfer of heat from the various components of the self-pixelating focal plane array while further providing addition structural support thereto. In an alternate embodiment, the readout device 14 may comprise a flex circuit architecture bonded or otherwise coupled to the photodetection portion 12. Optionally, the readout device 14 may include one or more electrical contact area formed thereon thereby permitting the readout device 14 to be electrically coupled to external circuits.

Figure 4:
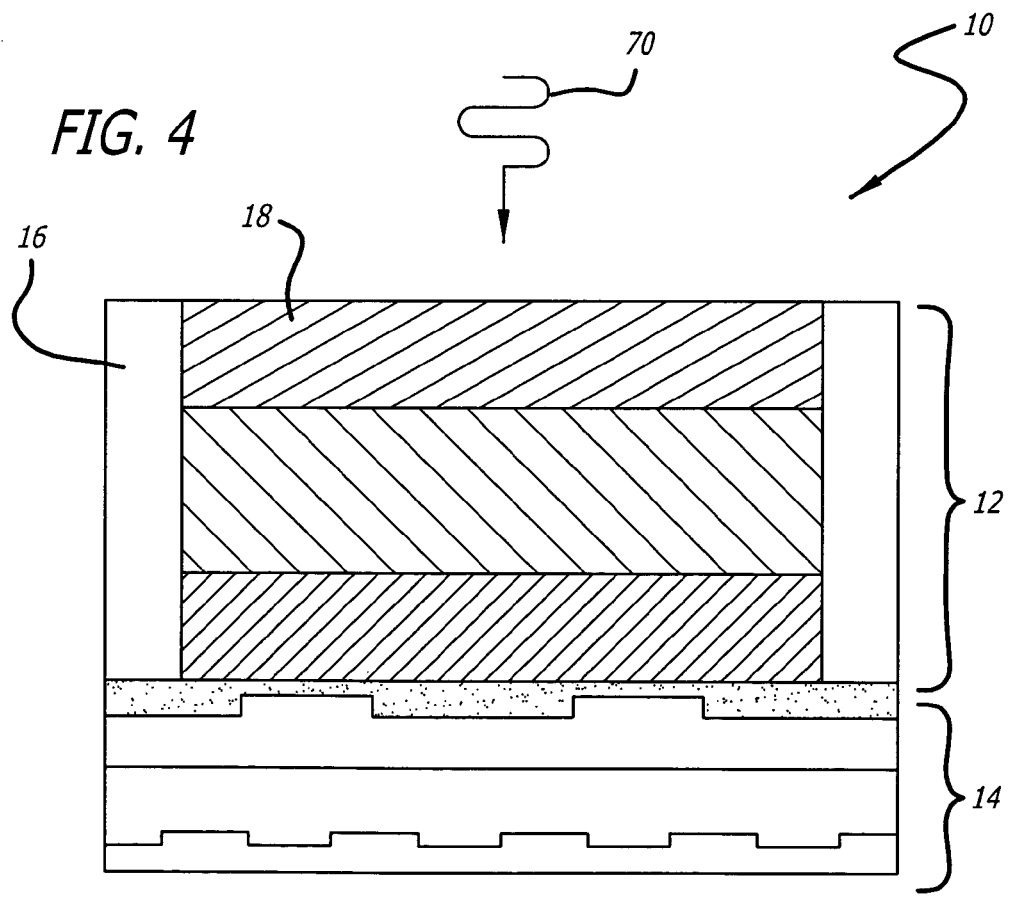
FIG. 4 shows a cross sectional view of an embodiment of a self-pixelating focal plane array during use wherein electromagnetic radiation is incident upon an embodiment of a photodetection portion.
Figure 5:
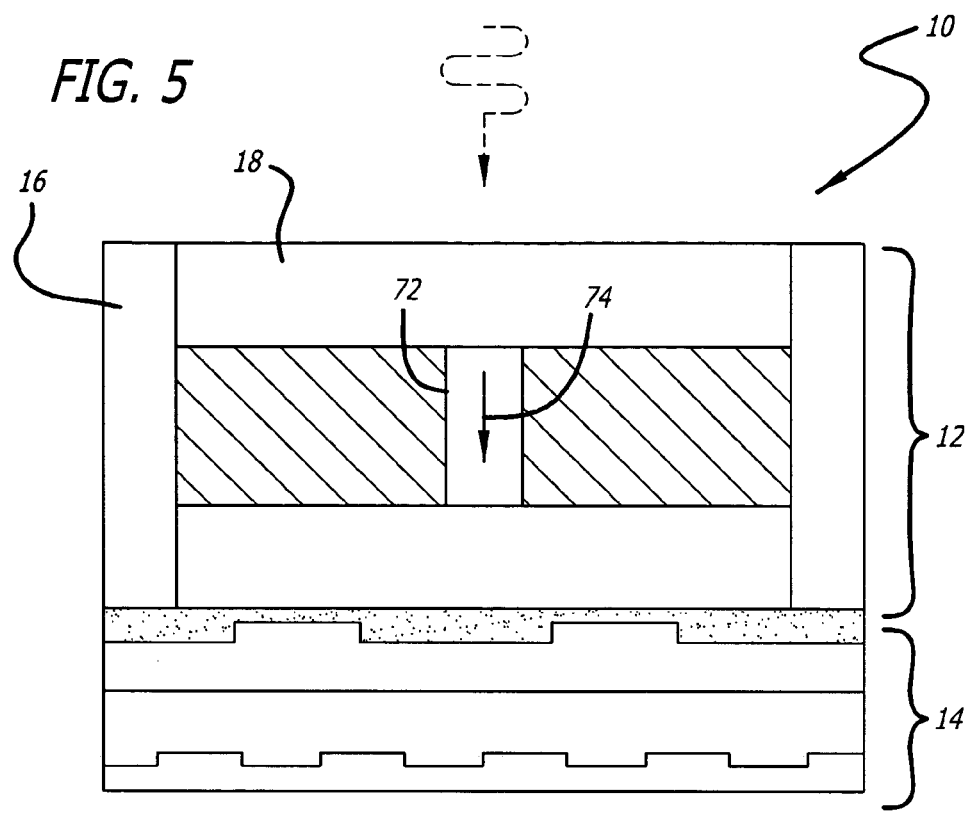
FIG. 5 shows a cross sectional view of the embodiment of the self-pixelating focal plane array shown in FIG. 4 wherein a micro-channel of avalanche-induced electrons is formed within the photodetection portion.
Figure 6:
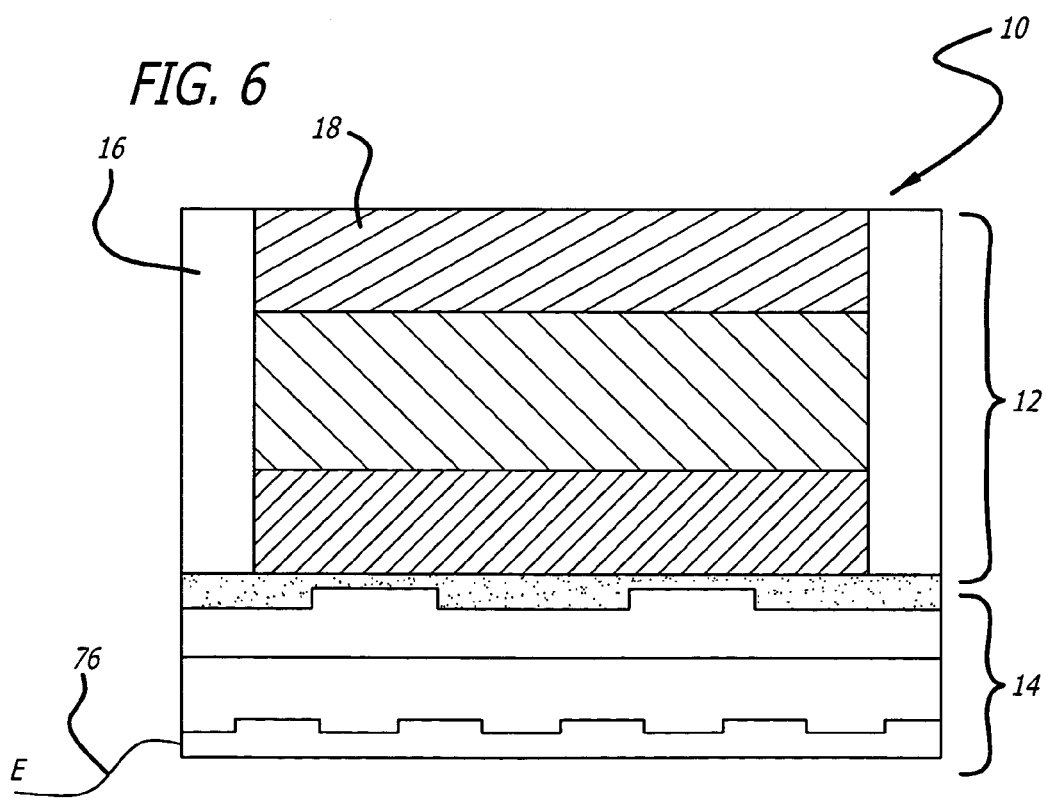
FIG. 6 shows a cross sectional view of the embodiment of the self-pixelating focal plane array shown in FIG. 4 wherein the readout device of the self-pixelating focal plane array is outputting an electrical signal.

The readout device 14 may be coupled to the photodetection portion 12 in any variety of ways. For example, the readout device 14 may coupled to the photodetection portion 12 using methods know in the art of flip-chip fabrication. As stated above, the photodetection portion 12 may comprise one or more avalanche photodiodes configured to operate in Geiger mode, and, as such, may be self-pixelating. As a result, the self-pixelating characteristics of the photodetection portion 12 of the embodiments of the devices disclosed herein greatly reduces or eliminates the precision alignment procedures commonly required during flip-chip fabrication. Therefore, during the manufacturing process, the precise alignment and registration of individual pixels of prior art photodetectors to prior art readout chips is substantially reduced or eliminated, thereby reducing production cost while improving production yields. FIGS. 4–6 show various views of an embodiment of the self-pixelating focal plane array during use. FIG. 4 shows energy 70, below the bandgap of the photodetection portion 14, incident on the self-pixelating focal plane array. The energy 70 is applied substantially perpendicular to a top surface of the active detection area 18 so the energy 70 is applied in a direction substantially parallel to electric field 36. (Ref. FIG. 2) The incidence of this energy 70 results in the generation of electron-hole pairs comprising an avalanche of electrons confined within the material forming the photodetection portion. When operated in Geiger mode the generation of the electron-hole pairs is focused within a micro-channel of the materials forming the photodetection portion 12. FIG. 5 shows the formation of a micro-channel 72 within the photodetection portion 12. As a result, an electrical signal 74 is formed within the micro-channel 72 and transmitted by the photodetection portion 12 to the readout device 14 electrically coupled thereto. Thereafter, the electrical signal 74 may be processed or otherwise modified by the readout chip 14. For example, the electrical signal 74 may be amplified by one or more integrated circuit devices 56 included within the readout device. (see FIG. 3). As shown in FIG. 6, the readout device 14 may output an output signal 76 to an electrical circuit or other device in electrical communication with the readout device 14.

Embodiments disclosed herein are illustrative of the principles of the invention. Other modifications may be employed which are within the scope of the invention, thus, by way of example but not of limitation, alternative photodetection devices, alternative readout device configurations, and alternate integrated circuit devices positioned on the readout device. Accordingly, the devices disclosed in the present application are not limited to that precisely as shown and described herein.

What is claimed is:

1. A device, comprising:
   a photodetection portion having a body defining a self-pixelating active detection region configured to receive incident energy, the received incident energy generating an avalanche of electrons confined in a micro-channel within the active detection region and forming an electrical signal; and
   a readout device in electrical communication with the photodetection portion and configured to capture the electrical signal from the photodetection portion.

2. The device of claim 1 wherein the photodetection portion comprises one or more avalanche photodiodes.

3. The device of claim 2 wherein the one or more avalanche photodiodes are manufactured from a material selected from the group consisting of Indium Gallium Arsenide, Silicon, Germanium, Gallium Nitride, and Silicon Carbide.

4. The device of claim 2 wherein the one or more avalanche photodiodes are configured to operate in Geiger mode.

5. The device of claim 1 wherein the photodetection portion further comprises a coupling layer formed thereon.

6. The device of claim 5 wherein the coupling layer further includes one or more contact areas formed thereon.

7. The device of claim 6 wherein the one or more contact areas are formed from an electrically conductive material.

8. The device of claim 1 wherein the readout device is flip-chip coupled to the photodetection portion.

9. The device of claim 1 wherein the readout device comprises one or more integrated circuit devices positioned on a semiconductor material.

10. The device of claim 9 wherein the integrated circuit devices are selected from the group consisting of amplifiers, processors, and assignment specific integrated circuits.

11. The device of claim 1 wherein the readout device includes at least one bond pad configured to electrically couple the readout device to the photodetection portion.

12. The device of claim 1 wherein the incident energy is below a bandgap of the photodetection portion.

13. A device, comprising:
   at least one photodiode having a body defining an active detection region configured to receive incident energy, the received incident energy generating an avalanche of electrons confined in a micro-channel within the active detection region and forming an electrical signal;
   a voltage source in communication with the at least one photodiode and configured to operate the at least one photodiode in Geiger mode; and
   a readout device in electrical communication with the at least one photodiode to capture the electrical signal.

14. The device of claim 13 wherein the one or more photodiodes are manufactured from a material selected from the group consisting of Indium Gallium Arsenide, Silicon, Germanium, Gallium Nitride, and Silicon Carbide.

15. The device of claim 13 wherein the readout device comprises one or more integrated circuit devices positioned on a semiconductor material.

16. The device of claim 13 wherein the readout device is coupled to the at least one photodiode in flip-chip relation.

17. The device of claim 13, wherein the voltage source in communication with the at least one photodiode is configured to create a first electric field across the at least one photodiode, the first electric field being substantially parallel to the path of the received incident energy.

18. The device of claim 17, further comprising:
   a second voltage source in communication with the at least one photodiode and configured to create a second electric field across the at least one photodiode, the second electric field being substantially perpendicular to the first electric field.

19. A system, comprising:
   at least one photodiode having a body defining an active detection region configured to receive incident energy, the received incident energy generating an avalanche of electrons confined in a micro-channel within the active detection region and forming an electrical signal, the at least one photodiode configured to operate in Geiger mode; and a readout device coupled to the at least one photodiode in flip chip relation, wherein the readout device is in electrical communication with the at least one photodiode.

20. A method, comprising:

providing a photodetection portion and a readout device;

configuring the photodetection portion to operate in Geiger mode;

coupling the readout device to the photodetection portion;

creating a self-pixelating photodetection portion by operating the photodetection portion in Geiger mode, the self-pixelating photodetection portion being configured to receive incident energy, the received incident energy generating an avalanche of electrons confined in a micro-channel and forming an electrical signal; and capturing electrical signals received from the photodetection portion with the readout device.

21. A method, comprising:

providing one or more avalanche photodiodes;

providing one or more flip-chip readout devices;

coupling the one or more flip-chip readout devices to the one or more avalanche photodiodes wherein the one or more flip-chip readout devices are in electrical communication with the one or more avalanche photodiodes;

biasing the one or more avalanche photodiodes to operate in Geiger mode wherein the avalanche photodiodes become self-pixelating, the avalanche photodiodes including a photodetection portion configured to receive incident energy, the received incident energy generating an avalanche of electrons confined in a micro-channel within the photodetection portion and forming an electrical signal; and capturing electrical signals generated within the avalanche photodiodes with the flip-chip readout devices.

* * * * *